United States Patent [19]

Kakuchi et al.

[11] 4,125,672
[45] Nov. 14, 1978

[54] POLYMERIC RESIST MASK COMPOSITION

[75] Inventors: Masami Kakuchi; Shungo Sugawara; Kei Murase; Kentaro Matsuyama, all of Mito, Japan

[73] Assignee: Nippon Telegraph and Telephone Public Corporation, Tokyo, Japan

[21] Appl. No.: 760,374

[22] Filed: Jan. 19, 1977

[30] Foreign Application Priority Data

Jan. 23, 1976 [JP] Japan .................................. 51/5827

[51] Int. Cl.$^2$ .............................................. B05D 3/06
[52] U.S. Cl. ..................................... 428/421; 96/36.2; 427/43; 427/273; 428/451
[58] Field of Search ...................... 427/43, 44, 54, 273; 204/159.14; 96/35, 36, 36.2, 115 R; 428/421, 422, 451; 526/245

[56] References Cited

U.S. PATENT DOCUMENTS

| | | | |
|---|---|---|---|
| 3,535,137 | 10/1970 | Haller et al. | 427/44 |
| 3,632,400 | 1/1972 | Burlant | 428/421 |
| 3,743,842 | 7/1973 | Smith et al. | 96/36.2 X |
| 3,993,834 | 11/1976 | Chimura et al. | 428/421 X |
| 4,011,351 | 3/1977 | Gipstein et al. | 427/43 |
| 4,061,829 | 12/1977 | Taylor | 427/43 |

Primary Examiner—John H. Newsome

Attorney, Agent, or Firm—Flynn & Frishauf

[57] ABSTRACT

A polymeric resist mask composition thinly coated on a semiconductor substrate, wherein the prescribed portions of said resist mask are exposed to high energy rays such as electron beams, X-rays or ultraviolet rays for degradation, and the degraded portions of the resist mask are removed by an organic solvent to present a prescribed resist mask pattern on the semiconductor substrate, which comprises a halogenated polymethacrylic ester whose composition is expressed by the general formula

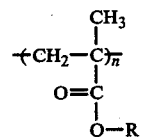

(where R denotes a halogenated alkyl radical including a halogen element selected from the group consisting of fluorine, chlorine and bromine, and at least one fluorine atom in case said radical contains chlorine or bromine and $n$ indicates an average polymerization degree of 100 to 20,000) and an organic solvent for said halogenated polymethacrylate.

8 Claims, No Drawings

POLYMERIC RESIST MASK COMPOSITION

This invention relates to a polymeric positive resist mask composition for use with high energy rays such as electron beams, soft X-rays or ultraviolet rays and more particularly to a polymeric resist mask composition mainly consisting of polymethacrylate derivatives.

In recent years, noticeable development has been made in the technique of presenting a prescribed pattern on a substrate by application of a resist mask prepared from polymeric material in order to effect the etching of various forms of substrate and diffusion of impurities therein in the field of manufacturing, for example, semiconductor elements, magnetic bubble elements and optical parts. Namely, the above-mentioned technique comprises the steps of forming a thin resist membrane by coating a resist mask composition on a substrate, irradiating high energy rays such as electron beams, soft X-rays or ultraviolet rays in the prescribed form to degrade those portions of the resist mask composition which are exposed to such high energy rays and dissolving said degraded portions to provide a desired resist mask pattern. With development of the technique of reducing the size of semiconductor elements to extreme fineness for grand scale integration, demand is made to establish the process of forming a resist mask pattern, the respective concave portions of which have a smaller width than 1 micron. In view of this situation, effective utilization of electron beams, X-rays, or ultraviolet rays is anticipated with great hope.

Literature related to this invention includes the specification of the U.S. Pat. No. 3,535,137 (invented by Ivan Haller et al). The U.S. patent sets forth a process of selectively impinging electron beams on a thin film of polymethacrylate for degradation, dissolving the degraded portions by a solvent, thereby providing a positive resist mask pattern.

The specification of another U.S. Pat. No. 3,779,806 (invented by Edward Gipstein et al) refers to isobutyl methacrylate polymer which is also applicable as a resist mask capable of being formed by application of electron beams.

The object of this invention is to provide a polymeric resist mask composition which is prominently sensitive to high energy rays such as electron beams, soft X-rays or ultraviolet rays, effects distinct resolution, and provides a resist mask pattern, the respective concave portions of which have a smaller width than 1 micron.

Namely, this invention provides a polymeric resist mask composition thinly coated on a semiconductor substrate, wherein the prescribed portions of said resist mask are exposed to electron beams, X-rays or ultraviolet rays for degradation, and the degraded portions of the resist mask are removed by an organic solvent to present a prescribed resist mask pattern on the semiconductor substrate, which comprises a halogenated polymethacrylic ester whose composition is expressed by the general formula

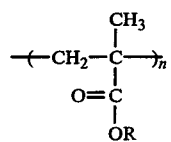

(where R denotes a halogenated alkyl radical including a halogen element selected from the group consisting of fluorine, chlorine, and bromine, and at least one fluorine atom, in case said radical contains chlorine or bromine and also less than 10 carbon atoms, and $n$ indicates an average polymerization degree of 100 to 20,000, or preferably 500 to 5000) and an organic solvent for said halogenated polymethacrylic ester.

The reason why a polymeric resist mask composition embodying this invention prominently absorbs high energy rays such as electron beams or soft X-rays is supposedly that said composition is far more sensitive to those high energy rays than any other resist mask composition proposed to date, and that any of the halogen elements such as fluorine, chlorine and bromine included in the subject resist mask composition can absorb high energy rays having energy ranging from several hundred electron volts to scores the killos of electron volts at a 2 to 3 fold higher rate than carbon.

Further, the fact that the polymeric resist mask composition of this invention has a high resolving power as later described is supposedly for the reason that the subject polymeric resist mask composition has the same main chain structure as the prior art polymethylmethacrylate which has been known to have a high resolving power and tends to suppress the occurrence of cross linking; and that impingement of high energy rays exclusively leads to the cutting of the main chain.

Moreover, the polymeric resist mask composition of this invention has excellent chemical resistance as later described and can fully withstand treatment applied in the ordinary process of manufacturing a semiconductor device. This advantageous feature is assumed to arise from the presence of halogen elements, particularly, fluorine in the subject resist mask composition.

Where an etched pattern is formed by application of the polymeric resist mask composition of this invention before manufacturing, for example, magnetic bubble memories, optical parts or semiconductor elements, a halogenated polymethacrylic ester, for example, a fluorinated methacrylate resin is dissolved in an organic solvent formed of an aliphatic ketones aliphatic alcohol, aromatic hydrocarbon, cyclic ketone, halogenated hydrocarbon, ester or mixtures thereof to provide a resist solution. Said resist solution may be applied on a substrate by means of, for example, a spinner to form a thin resist mask of uniform thickness. The thickness of said resist mask can be adjusted by varying the concentration of the resist solution and the revolving speed of the spinner.

Formation of the resist mask on a substrate in a prescribed pattern is carried out by irradiating electron beams according to a predetermined pattern, impinging soft X-rays through a previously provided mask, or sending forth ultraviolet rays through a proper mask. In this case, electron beams should be applied in a sufficient amount to degrade the resist mask material of this invention. An amount of electron beams being irradiated can be experimentally determined with ease.

The portions of the resist mask material degraded by for example, electron beams is subsequently developed by a developer. As used herein, the form "development" means the process of removing the high energy-degraded portions of the resist mask material by applying a solution which dissolves those portions of the resist mask material which are not exposed to high energy rays such as electron beams or soft X-rays at a fully slower rate than that at which the low molecular portions of said resin material degraded by impingement of said high energy rays are dissolved, thereby providing a prescribed resist mask pattern. Where the underlying substrate is to be worked after development, the larger thickness of the remaining high molecular portions of the resist mask material is less likely to give rise to pinholes, thus rendering the working of the substrate more reliable. Therefore, more preferred is that type of developer which gives a greater difference in dissolving rate between the higher molecular portion of the resist mask material and the degraded lower molecular portion thereof. Accordingly, the developer is selected from the group consisting of, for example, an aliphatic alcohol, aliphatic ketone, halogenated hydrocarbon, ether, ester and mixtures thereof.

The polymeric resist mask composition of this invention mainly consists of a halogenated polymethacrylic ester containing a fluorinated alkyl radical whose composition is expressed by the general formula:

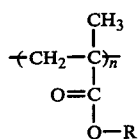

(where R denotes a halogenated alkyl radical including a halogen element selected from the group consisting of fluorine, chlorine and bromine and at least one fluorine atom, in case said radical contains chlorine or bromine and also less than 10 carbon atoms, and $n$ indicates an average polymerization degree of 100 to 20,000, or preferably 500 to 5,000).

As used herein, the term "fluorinated alkyl radical" is defined to mean not only the type having part or all of the contained hydrogen atoms substituted by fluorine alone, but also a fluorine-containing alkyl radical, part of which is substituted by chlorine or bromine.

Further, R of the above-mentioned general formula may be concretely expressed as follows:

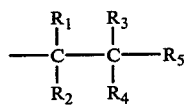

(where $R_1$ and $R_2$ are substituents selected from the group consisting of hydrogen, methyl radical, ethyl radical, propyl radical, chloromethyl radical (—CH$_2$Cl), and trifluoromethyl radical (—CF$_3$); $R_3$ and $R_4$ are substituents selected from the group consisting of hydrogen, methyl radical and fluorine; and $R_5$ is a substituent selected from the group consisting of a fluoroalkyl radical containing 1 to 8 carbon atoms, fluorine and bromine.

The methacrylic ester containing the above-defined fluorinated alkyl radical is prepared by reacting a fluorinated aliphatic alcohol with methacrylic acid or methacrylate. The methacrylic ester containing a fluorinated alkyl radical is easily polymerized by a known polymerization catalyst. The process of synthesizing a fluorinated aliphatic alcohol is disclosed by H. Muramatsu in the Journal of Organic Chemistry, Vol 27, p.2325, 1962.

This invention will be more clearly understood by reference to the examples which follow.

EXAMPLE 1

(Method of manufacturing monomeric 2,2,3,4,4,4-hexafluorobutyl methacrylate ester)

A 500cc three-way flask was fitted with a reflux condenser provided with a nitrogen feed tube, thermometer and drying tube filled with anhydrous calcium chloride. The flask was charged with 126g of methacrylic chloride, 182g of 2,2,3,4,4,4,-hexafluorobutanol and 0.5g of hydroquinone dimethyl ether as a polymerization inhibitor. The flask was further fitted with a sulfonic acid washing bottle, calcium chloride drying tube, and three empty traps all connected in series. The flask was heated while dry nitrogen gas was blown thereinto at the rate of about 1 cc/second. When reaction temperature rose from 90° to 100° C., hydrogen chloride gas began to evolve from the outlet of the calcium chloride drying tube. When evolution of hydrogen chloride gas was decreased after 3-hours heating, reaction was regarded as being substantially brought to an end. After being cooled, the reaction liquid was transferred to a liquid-separating funnel. The transferred liquid was washed, for example, four times with 100cc of a 2% aqueous solution of sodium hydroxide, until the pH of the water phase stood at 7. After an oil phase was separated, drying was carried out with addition of 5g of anhydrous magnesium sulfate. After separation of an oil substance, 1g of hydroquinone dimethyl ether was added as an inhibitor of thermal polymerization. At this time, a distillator was further fitted to the flask. Vacuum distillation was repeated twice in an atmosphere of nitrogen, providing 190g of 2,2,3,4,4,4-hexafluorobutyl methacrylate having a boiling point of 60° to 63° C. (as measured at 20 mm Hg). Further, a monomeric methacrylic ester containing a fluorinated alkyl radical was prepared by the same process as described above with the 2,2,3,4,4,4-hexafluorobutanol replaced by 2,2,3,3-tetrafluoropropanol, 2,2,3,3,4,4,5,5-octafluoropentanol, 1,1-dimethyl-2,2,3,3,4,4,5,5,-octafluoropentanol, 1,1-dimethyl-2,2,3,3,-tetrafluoropropanol, 1H,1H,3H-perfluorodecanol, 1-methyl-2,2,3,4,4,4-hexafluorobutanol, 1-ethyl-2,2,3,4,4,4-hexaflurobutanol, 1-n-propyl-2,2,3,4,4,4-hexafluorobutanol, 1,1-dimethyl-2,2,3,4,4,4-hexafluorobutanol, 1,1-dimethyl-2,2,3,4,4,4-hexafluorobutanol, 2,2-dimethyl-3,3,4,5,5,5-hexafluoropentanol, 1-chloro-3-fluoro-2-propanol, 1,1,1,3-tetrafluoro-3-bromo-2-propanol, 1,1,1,3,3,3-hexafluoro-2-propanol, and 2,2,2-trifluoroethanol.

EXAMPLE 2

(Polymerization of 2,2,3,4,4,4-hexafluorobutyl methacrylate)

A 50cc glass ampoule previously washed and dried was charged with 10g of 2,2,3,4,4,4-hexafluorobutyl methacrylate and 0.1g of benzoyl peroxide. The glass ampoule was connected to an evacuated tube. The contents of the glass ampoule were frozen by liquefied nitrogen. The contents were melted by warm water, followed by deaeration. After the above-mentioned operation was repeated three times, the glass ampoule was sealed. The contents of the glass ampoule were polymerized at 60° C. for 24 hours. After the glass ampoule was opened, the contents were dissolved in methylethyl. When the solution was poured into a large excess of hexane with stirring, a white polymer was precipitated. After being dried, the white polymer was again dissolved in methylethel ketone. The solution was poured into hexane for precipitation. The precipitate obtained was dried in vacuum, providing 6g of white powdery polymer. A solution of said polymer in the methyl ethyl ketone at 30° C. indicated an intrinsic viscosity number of 0.87.

Determination by the gel-permeation-chromatograph analysis showed that $\overline{M}_N$ was 180,000 and $\overline{M}_W$ was 500,000, that is, the ratio of $\overline{M}_W$ to $\overline{M}_N$ was 2.8. The thermal mechanical analysis and differential scanning calorimetic analysis showed the glass transition temperature to be Tg 50° and 57° C. respectively. The elemental analysis of the above-mentioned polymer is given in Table 1 below.

Table 1

| Element | Measured content (%) | Theoretical content (as $C_8H_8O_2F_6$) (%) |
|---|---|---|
| C | 38.3 | 38.4 |
| H | 3.1 | 3.2 |
| O | 12.9 | 12.8 |
| F | 45.7 | 45.6 |

Other forms of monomeric methacrylic esters were polymerized in the same manner as described above, providing methacrylic polymers. The boiling points of the raw fluoroalcohols and monomers and the properties (intrinsic viscosity number and softening point of the polymers) are indicated in Table 2 below.

Usable for the object of this invention is a resist mask material having an average polymerization degree ranging from 100 to 20,000 or preferably from 500 to 5,000. When coated, a resist mask material having a smaller polymerization degree than 100 has too low a mechanical strength for practical application. Conversely, a resist material having a larger polymerization degree than 20,000 indeed has a satisfactory mechanical strength, but presents difficulties in selecting a suitable solvent.

Table 2

| Sample No. | Kind of halogenated alcohol (R—OH) | Boiling point of said halogenated alcohol (° C) | Boiling point of derivatives of the monomeric methacrylic ester (° C/mm Hg) | Intrinsic viscosity number ($\eta$) | Softening point (° C) |
|---|---|---|---|---|---|
| 1 | $HCF_2CF_2CH_2$—OH | 110 | 69–74/50 | 1.10 | 75 |
| 2 | $HCF_2CF_2CF_2CF_2CH_2$—OH | 140 | 78–82/20 | 0.91 | 40 |
| 3 | $HCF_2$—$CF_2$—$C(CH_3)_2$—OH | 119 | 70/20 | 0.70 | 93 |
| 4 | $HCF_2CF_2CF_2CF_2$—$C(CH_3)_2$—OH | 153 | 91–92/20 | 0.63 | 65 |
| 5 | $CF_3(CF_2)_6CFHCF_2CH_2$—OH | 201 | — | 0.32 | 40 |
| 6 | $CF_3CFHCF_2CH_2$—OH | 114 | 72–63/20 | 0.87–1.0 | 50 |
| 7 | $CF_3CFHCF_2$—CH(CH_3)—OH | 117 | 64/20 | 0.59 | 63 |
| 8 | $CF_3CFHCF_2$—CH(CH_2CH_3)—OH | 133–4 | 85–87/20 | 0.59 | 47 |
| 9 | $CF_3$—$CFHCF_2$—CH(CH_2CH_2CH_3)—OH | 149–150 | 95–96/20 | 0.52 | 45 |
| 10 | $CF_3CFHCF_2$—$C(CH_3)_2$—OH | 127 | 70–74/20 | 0.57 | 83 |
| 11 | $CF_3CFHCF_2$—$C(CH_3)(CH_2CH_3)$—OH | 145 | 87–89/20 | 0.35 | 73 |
| 12 | $CF_3CFHCF_2$—$C(CH_3)(CH_3)$—$CH_2$—OH | 132 | 84–87/20 | 0.43 | 50 |
| 13 | H—CFH—C(CH_2Cl)H—OH | 153–6 | — | 0.39 | 63 |

Table 2-continued

| Sample No. | Kind of halogenated alcohol (R—OH) | Boiling point of said halogenated alcohol (° C) | Boiling point of derivatives of the monomeric methacrylic ester (° C/mm Hg) | Polymer obtained Intrinsic viscosity number ($\eta$) | Softening point (° C) |
|---|---|---|---|---|---|
| 14 | F   CF$_3$<br>  \|    \|<br>Br—C—C—OH<br>  \|    \|<br>H   H | 124 | — | 0.32 | —*** |
| 15 | F   CF$_3$<br>  \|    \|<br>F—C—C—OH<br>  \|    \|<br>F    H | 59 | 50/140 | 0.61 | —*** |
| 16 | F    H<br>  \|    \|<br>F—C—C—OH<br>  \|    \|<br>F    H | 749 | 126–130/74 | 0.5 | 86 |

*($\eta$) Measured in methylethyl ketone at 30° C
** Measured by thermal mechanical analysis
*** Failed to be solidified

EXAMPLE 3

(Application of 2,2,3,4,4,4-hexafluorobutyl methacrylate polymer as a resist mask)

1g of poly-2,2,3,4,4,4-hexafluorobutyl methacrylate was dissolved in 10cc of methylethyl ketone to provide a resist mask solution. The resist mask solution was coated on a silicon wafer with a thickness of about 0.5 micron by spin coating. A resist mask was formed by vacuum heating at 90° C. for 20 minutes, followed by cooling to room temperature. Soft X-rays such as L-line of molybdenum were irradiated at a width of one micron on a silicon wafer coated with the resist mask. After application of the soft X-rays, the silicon wafer coated with the resist mask was dipped 30 seconds in isopropanol used as a developer. Only those portions of the resist mask which were exposed to the soft X-rays were removed, providing a desired resist mask pattern. In this case, the soft X-rays were applied in an amount of 180 millijoule/cm$^2$.

Further, a fresh resist mask prepared from the subject hexafluorobutyl methacrylate was selectively removed by another developer consisting of a mixture of isopropanol and methylisobutyl ketone. The mixing ratio and the required dosage of X-rays are presented in Table 3 below.

Table 3

| Mixing ratio of developer components (Isopropanol: methylisobutyl ketone) | Dosage of X-rays* (mJ/cm$^2$) |
|---|---|
| 200:1 | 120 |
| 150:1 | 52 |
| 100:1 | —** |

*L-line of molybdenum
**Both portions of the resist mask which were and were not exposed to X-rays were dissolved away The resolving property of the resist mask of this invention was determined from those changes in the thickness of the remaining portion of the resist mask after development which corresponded to the dosage of X-rays. Now, let it be assumed that E$_0$mJ/cm$^2$ denotes the dosage of X-rays which causes the portions of the resist mask exposed to X-rays to begin to be reduced in thickness by a developer, and that E mJ/cm$^2$ represents the dosage of X-rays which effects the full removal of the X-ray exposed portions of the resist mask by a developer. Then, an index $\gamma$ showing the resolving property of the resist mask may be expressed by the following equation:

$$\gamma = (\log \frac{E}{E_o})^{-1}$$

The higher the value of $\gamma$, the more improved the resolving property. A resist mask material in which $\gamma$ has a larger value than about 1.5 is known to display a resolving property capable of forming a resist mask pattern whose respective concave portions have a width of 1 micron. Evaluation of the resolving property of a resist mask on the basis of the value of $\gamma$ is already described in the Journal of the Electrochemical Society, Vol. 121, No. 11, 1974, page 1500. The value of $\gamma$ is also affected by the temperature of a developer. Generally, the higher the developer temperature, the more prominent the declining tendency of the $\gamma$ value.

The resist mask of this invention has a soft Xray irradiation characteristic shown in Table 4 below. The sample numbers of Table 4 correspond to those of Table 2.

Table 4

| Sample No. | Sensitivity (mJ/cm$^2$) | $\gamma$ value | Developer |
|---|---|---|---|
| 1 | 64 | 1.6 | Isopropanol : Methylisobutyl ketone = 6 : 1 |
| 2 | 100 | 5.3 | 10 : 1 |
| 3 | 160 | 1.1 | 4 : 1 |
| 4 | 64 | 1.6 | 6 : 1 |
| 5 | 70 | 4 | 10 : 1 |
| 6 | 103 | 4.5 | Isopropanol |
| 7 | 80 | 4.5 | " |
| 8 | 46 | 4.5 | " |
| 9 | 70 | 2.5 | " |
| 10 | 53 | 3 | " |
| 11 | 62 | 2.7 | " |
| 12 | 33 | 2.2 | " |
| 13 | 250 | 2.2 | " |
| 14 | 200 | 2.7 | " |
| 15 | 270 | 3.1 | " |
| 16 | 210 | 3.5 | " |

EXAMPLE 4

(Application of the resist material of this invention on a SiO$_2$ layer formed on a silicon substrate and also on a chromium layer plated on a glass plate)

A resist mask solution prepared by dissolving 1g of poly-2,2,3,4,4,4-hexafluorobutyl methacrylate in 10cc of methylethyl ketone was applied on a SiO$_2$ layer formed on a silicon substrate. Vacuum heating was applied at 90° C. for 20 minutes. Thereafter, soft X-rays were irradiated and development was made of the portions of the resist material exposed to X-rays by a solvent formed of a mixture of isopropanol and methylisobutyl ketone. After heating was further applied at 75° C. for 30 minutes, those exposed portions of the SiO$_2$ layer from which the resist mask material was removed were etched by an etchant having a composition of 46% NH$_4$F : 41% HF : H$_2$O = 8.6 : 1: 6). It has found that said etching was carried out without little affecting the SiO$_2$ layer underlying those remaining portions of the resist mask which were not exposed to soft X-rays.

EXAMPLE 5

A resist mask solution of poly-2,2,3,4,4,4-hexafluorobutyl methacrylate was applied on a chromium layer plated on a glass substrate to provide a resist mask. After soft X-rays were impinged on the resist mask, development was made of the resist mask exposed to X-rays in the same manner as in Example 4. After post baking at 75° C. for 30 minutes, those portions of the chromium layer which were exposed due to the removal of the resist mask by a developer were etched by an etchant formed of 165g of nitric secondary cerium ammonium salt, 40cc of 70% HClO$_4$ and 1000cc of H$_2$O. Said etching was effected without affecting those portions of the chromium plating which underlay the remaining portions of the resist mask.

Where the soft X-rays were replaced by electron beams (accelerated with 20kV), it was necessary to apply a charge of 4 × 10$^{-7}$ coulomb/cm$^2$ for full removal of those portions of a resist mask which were exposed to said electron beams by a developer formed of isopropanol and methylisobutyl ketone mixed in the ratio of 150:1.

Where ultraviolet rays having a wavelength of 1500 to 2500Å units were irradiated from a heavy hydrogen discharge tube in place of soft X-rays, it was necessary to apply said ultraviolet rays at the rate of 100 mJ/cm$^2$ for full removal of those portions of a resist mask which were exposed to said ultraviolet rays be a developer formed of isopropanol and methylisobutyl ketone mixed in the ratio of 150:1. With the known positive resist mask prepared from polymethylmethacrylate, the above-mentioned ultraviolet rays had to be applied at the rate of 600 mJ/cm$^2$ for full removal of those portions of the resist mask which were exposed to said ultraviolet rays by a developer formed of isopropanol and methylisobutyl ketone mixed in the ratio of 3:1. The resist material of this invention absorbs ultraviolet rays having wavelengths bordering on 2200A units. Where, therefore, ultraviolet rays are emitted from a heavy hydrogen discharge tube or through a filter of a mercury lamp, then the present resist mask having a thickness of about 1 micron absorbs about 20% of said ultraviolet rays.

Comparison was made between a resist material of this invention and that of the prior art in respect of sensitivity to soft X-rays and electron beams and γ value, the results being set forth in Table 5 below.

Table 5

| | Sensitivity to soft X-rays* (mJ/cm$^2$) | γ value |
|---|---|---|
| Resist mask material of this invention | 33 to 270 | 1.1 to 5.3 |
| Resist mask material of the prior art (Polymethylmethacrylate) | 2500 | 1.7, 3.3** |

*Source : L-line of molybdenum
**Disclosed in Journal of the Electrochemical Society, Vol. 121, No. 11, 1974

It has been proved that the resist material of this invention has a higher sensitivity to ultraviolet rays having a wavelength of 2000 to 2500Å; the exposed portions of a SiO$_2$ or chromium layer underlying said resist mask material can be etched without damaging the nonexposed portions of said layer; no deterioration occurs in the property of the present resist material even if allowed to stand in a bright room as long as one year; and the present resist mask material has as high resistance and stability to chemicals as the prior art resist mask material of polymethylmethacrylate.

What we claim is:

1. A polymeric resist mask composition thinly coated on a semiconductor substrate, wherein prescribed portions of said resist mask are exposed to high energy rays such as electron beams, X-rays, or ultraviolet rays for degradation, and the degraded portions of the resist mask are removed by an organic solvent to present a prescribed resist mask pattern on the semiconductor substrate, which comprises a fluorine-containing polymethyl methacrylate whose composition is expressed by the formula

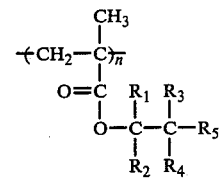

wherein R$_1$ and R$_2$ are substituents selected from the group consisting of hydrogen, methyl, ethyl, propyl, chloromethyl, and trifluoromethyl; R$_3$ and R$_4$ are substituents selected from the group consisting of hydrogen, methyl and fluorine, and R$_5$ is a fluoroalkyl radical containing from 1 to 8 carbon atoms, fluorine and bromine, and n indicates an average polymerization degree of from about 100 to about 20,000; and an organic solvent for said fluorine-containing polymethyl methacrylate.

2. A polymeric resist mask composition according to claim 1, wherein the fluorine-containing polymethacrylic ester has an average polymerization degree of 500 to 5000.

3. A polymeric resist mask composition according to claim 1, wherein the organic solvent for said fluorine-containing polymethyl methacrylate is methylethyl ketone.

4. A polymeric resist mask composition according to claim 1, which is prepared by dissolving 1g of a fluorine-containing methacrylic ester in 10cc of methylethyl ketone.

5. A polymeric resist mask composition according to claim 1, wherein the fluorine-containing methacrylic ester is coated on a silicon oxide layer formed on a silicon wafer substrate.

6. A polymeric resist mask composition according to claim 1 wherein the fluorine-containing methacrylic ester is 2,2,3,4,4,4-hexafluorobutyl methacrylate.

7. A polymeric resist mask composition of claim 1 wherein said organic solvent for removing the degraded portions of resist mask composition is a solution of 200 parts of isopropanol and 1 part of methylisobutyl ketone.

8. A polymeric resist mask composition of claim 1 wherein said organic solvent for removing the degraded portions of resist mask composition is a solution of 150 parts of isopropanol and 1 part of methyl-isobutyl ketone.

* * * * *